United States Patent [19]
Kumesawa et al.

[11] Patent Number: 5,892,251
[45] Date of Patent: Apr. 6, 1999

[54] APPARATUS FOR TRANSFERRING ELECTRIC CHARGES

[75] Inventors: Tetsuro Kumesawa; Hiromichi Matsui, both of Kanagawa, Japan

[73] Assignee: Sony Corporation, Japan

[21] Appl. No.: 892,935

[22] Filed: Jul. 15, 1997

Related U.S. Application Data

[63] Continuation of Ser. No. 4,659, Jan. 14, 1993, abandoned, which is a continuation of Ser. No. 537,111, Jun. 13, 1990, abandoned.

[30] Foreign Application Priority Data

Jun. 25, 1989 [JP] Japan .................................. 1-162430

[51] Int. Cl.⁶ ...................... H01L 27/148; H01L 29/768
[52] U.S. Cl. ...................... 257/239; 257/236; 257/245; 257/246
[58] Field of Search .................. 357/24 M; 257/236, 257/239, 245, 246

[56] References Cited

U.S. PATENT DOCUMENTS

| | | | |
|---|---|---|---|
| 4,603,426 | 7/1986 | Sauer | 357/24 M |
| 4,873,562 | 10/1989 | Cazanx et al. | 377/61 |

FOREIGN PATENT DOCUMENTS

| | | | |
|---|---|---|---|
| 0191587 | 8/1986 | European Pat. Off. | 257/239 |
| 0192142 | 8/1986 | European Pat. Off. | 357/24 M |
| 56-32764 | 4/1981 | Japan | 327/24 M |
| 59-13373 | 1/1984 | Japan | 357/24 M |
| 59-201468 | 11/1984 | Japan | 257/239 |
| 59-229834 | 12/1984 | Japan | 357/24 M |
| 60-91671 | 5/1985 | Japan | 357/24 M |
| 61-285761 | 12/1986 | Japan | 257/239 |
| 1-248664 | 10/1989 | Japan | 257/239 |
| 2054961 | 2/1981 | United Kingdom | 357/24 M |

*Primary Examiner*—Ngân V. Ngô
*Attorney, Agent, or Firm*—Ronald P. Kananen; Rader, Fishman & Grauer

[57] ABSTRACT

A charge transferring apparatus comprising, e.g., a buried type charge coupled device in which a pair of transfer electrodes located at the most downstream point of a charge transfer direction is driven by a drive pulse other than that for any other pair of transfer electrodes and a potential well formed at the pair of the transfer electrodes located at the most downstream point is made shallower than that at any other pair of transfer electrodes allowing the output dynamic range of a charge transfer device to be increased for improving the output quality.

12 Claims, 1 Drawing Sheet

APPARATUS FOR TRANSFERRING ELECTRIC CHARGES

This application is a continuation of application Ser. No.08/004,659 filed Jan. 14, 1993, now abandoned, which is a continuation of application Ser. No. 07/537,111 filed Jun. 13, 1990, now abandoned.

BACKGROUND OF THE INVENTION

(1) Field of the Invention

The present invention relates to an apparatus for transferring electric charges and, more particularly, relates to an apparatus for transferring electric charges in which the transferring electrodes are constituted by a plurality of transferring electrodes which are adjoined together in a charge transfer direction and a plurality of pairs of the electrodes are arranged along the transfer direction.

(2) Background of the art

Solid-state image sensing devices including charge coupled devices (CCDs) have been used for photographic elements in video cameras, still cameras, and so forth.

A structure of output ports for horizontal (output) register portions in these image sensing devices has been proposed.

It is necessary to enhance transferring efficiency in a transferring apparatus such as the horizontal register since the output dynamic range of the output register must be widened to some degree. It is not easy to achieve both enhanced transferring efficiency and widened output dynamic range.

In other words, to provide a sharp (clearly focused, high resolution) video image with high transferring efficiency, it is necessary to deepen a whole potential of a charge transferring channel to raise a potential relative to a zero potential). However, to deepen the whole potential is to narrow the dynamic range of a floating diffusion region. The floating diffusion region denotes an $n^{++}$ type semiconductor region disposed at a position corresponding to a lower side of the output port of the output register downstream of an output port electrode.

That is to say, since the dynamic range of the floating diffusion region is determined according to a difference between the potentials of the dynamic range of the floating diffusion region and that of the output gate electrode, the potential difference becomes correspondingly smaller if the potential at the output gate electrode side is deepened. Hence, it is difficult to enhance the transferring efficiency without narrowing the dynamic range.

If the potential of the floating diffusion region is deepened, the output dynamic range can be widened. However, it becomes necessary to make higher the power supply voltage applied to a precharge drain region. The precharge drain region denotes an $n^{++}$ type semiconductor region formed on a surface portion of the n type semiconductor region at a position slightly downstream and spaced apart from the floating diffusion region. If the power supply voltage (Vdd) is increased, an amplifier (the amplifier which detects and amplifies the potential of the floating diffusion electrode) would largely consume the power and would make the drain voltage applied to an MOS (Metal Oxide Semiconductor) transistor constituting the amplifier higher, to a value equal to or nearly equal to the breakdown voltage that the MOS transistor inherently provides.

SUMMARY OF THE INVENTION

It is an object of the present invention to provide a charge transferring apparatus which can widen an output dynamic range and enhance the transferring efficiency without increase in the power supply voltage.

The above-described object can be achieved by providing an apparatus for transferring electric charges through a transfer channel formed therein, comprising: a) a plurality of pairs of charge transfer electrodes, each pair of transfer electrodes constituting one transfer electrode together with a mutually adjoining transfer electrode and being aligned in a transfer direction; b) a charge detecting portion; and c) first means for driving each pair of transfer electrodes with a drive pulse such that a first pair of transfer electrodes located adjacent to the charge detecting portion is driven with a first drive pulse different from the other pairs of transfer electrodes, so that a potential well formed at the first pair of transfer electrodes when a signal charge placed around the first pair of transfer electrodes is swept out toward the charge detecting portion is shallower than other potential wells formed at the other pairs of transfer electrodes.

The above-described object can also be achieved by providing an image sensing apparatus comprising: a) a plurality of electrodes aligned in a charge transfer direction including, a plurality of first electrodes storing a signal charge and a plurality of second electrodes transferring the signal charge toward the charge transfer direction, each first electrode being electrically interconnected to a corresponding second electrode to form an electrode pair, the electrode pair at the most downstream point of the transfer direction being a first electrode pair; b) a charge detecting portion adjacent to the first electrode pair and c) a drive pulse generator generating a first drive pulse for the first electrode pair and a second drive pulse for other electrode pairs so that a potential well formed at the first electrode pair is shallower than that of any other electrode pairs.

DETAILED DESCRIPTION OF THE PREFERRED EMBODIMENT

Reference will hereinafter be made to the drawings in order to facilitate a better understanding of the present invention.

Figure 1:
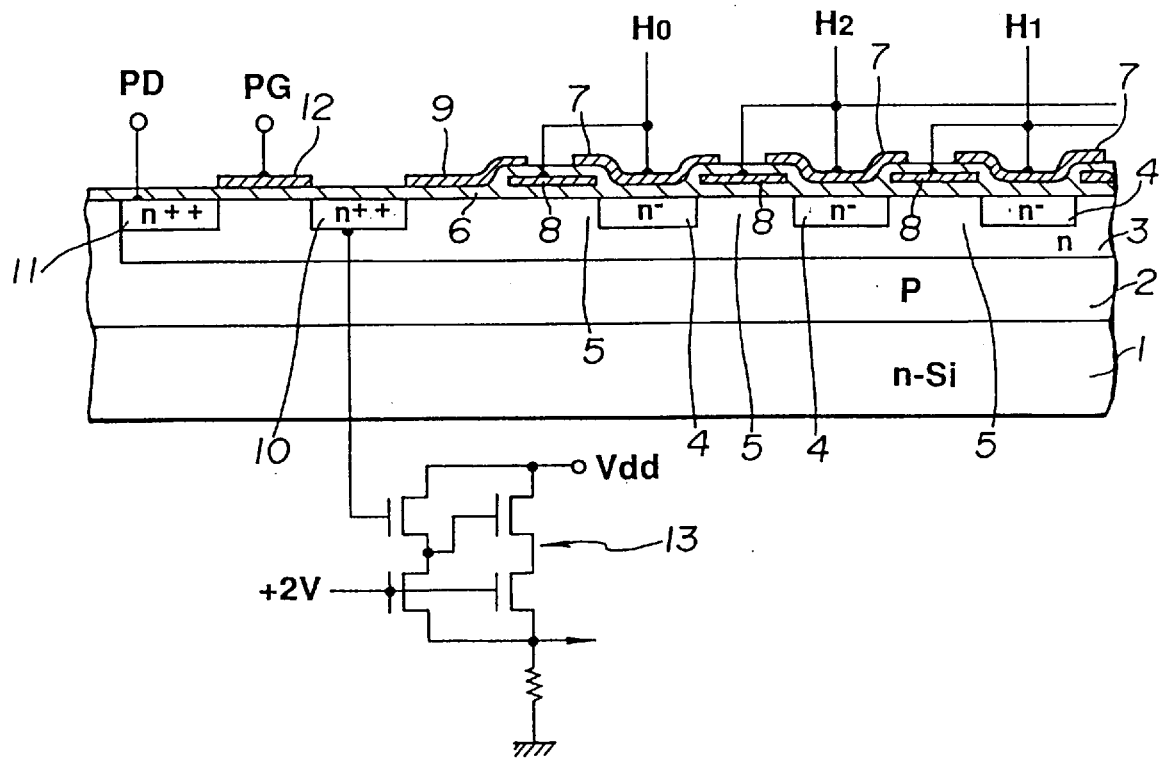
FIG. 1 is an explanatory view of a circuit structure of an electric charge transferring apparatus according to the present invention.

FIG. 1 shows a preferred embodiment of a charge transferring apparatus according to the present invention.

In FIG. 1, numeral 1 denotes an n type semiconductor substrate made of silicon. Numeral 2 denotes a P type semiconductor region formed on the semiconductor substrate 1 and numeral 3 denotes an n type semiconductor region selectively formed on a surface of the P type semiconductor region 2.

In addition, a plurality of $n^-$ type semiconductor regions 4, 4, - - - , are formed on a surface of the n type semiconductor region 2 and are arranged at predetermined intervals of distances along a charge transfer direction. The $n^-$ type semiconductor regions 4, 4, - - - , are called transfer regions. Storage regions 5, 5, - - - are provided between the respective transfer regions 4, 4, - - - .

It is noted that an electric charge transfer channel to transfer a signal charge is formed along the transfer direction if the transfer regions 4, 4, - - - , and storage regions 5, 5, - - - are alternately arranged.

Furthermore, a transfer electrode 7 and storage electrode 8 are formed on each transfer region 4 and each storage region 5 via an insulating layer 6 made of, e.g., $SiO_2$.

Each pair of transfer electrodes (denoted by portions attached with $H_o$, $H_1$, and $H_2$) is constituted by one transfer electrode 7 and one storage electrode 8 installed at a location downstream of the corresponding transfer electrode with respect to the transfer channel. Each transfer electrode 7 and storage electrode 8 are electrically interconnected, constituting one transfer electrode pair as shown in FIG. 1.

Each pair of the transfer electrodes receives one bi-phase drive pulse $H_o$, $H_1$, or $H_2$.

An $n^{++}$ type semiconductor region selectively formed on the surface portion of the n type semiconductor region 3 is formed as a floating diffusion region 10 placed at a position on the n type semiconductor region downstream of the output gate electrode 9.

A precharge drain region 11 is constituted by the $n^{++}$ type semiconductor region formed on the surface of the n type semiconductor region 3 and is placed at a position slightly spaced apart from and downstream of the floating diffusion region 10. The precharge drain region 11 receives a power supply voltage of, for example, plus twelve (+12) volts, or a multiple thereof. A precharge gate electrode 12 is formed on a portion between the floating diffusion region 10 and precharge drain region 11 via the insulating layer 6. The precharge gate electrode 12 receives a precharge gate pulse the voltage of which varies in synchronization with the bi-phase drive pulses $H_1$ and $H_2$. An amplifier 13 is provided to detect and amplify the potential at the floating diffusion region 10.

It is noted that, in the preferred embodiment, the pair of the transfer electrodes 7 and 8 adjacent to the charge detecting portion constituted by the floating diffusion region 10 and amplifier 13 is electrically separated from the other transfer electrodes and is driven by an exclusive drive pulse $H_o$. The drive pulse $H_o$ is in the same phase as the drive pulse $H_1$ (i.e., 5 volts). The voltage applied to the storage regions 5, 5, - - - is the same as that of the drive pulse $H_1$ when the signal electric charge is stored in the respective storage regions. However, in the preferred embodiment, the voltage, when the signal electric charge is swept out, (,i.e., −4 volts) is set to several volts lower than the drive pulse $H_1$ (,i.e., zero volts). That is to say, the swing range of the voltages of the exclusive drive signal $H_o$ becomes larger than those in a previously proposed transferring apparatus.

Figure 2:
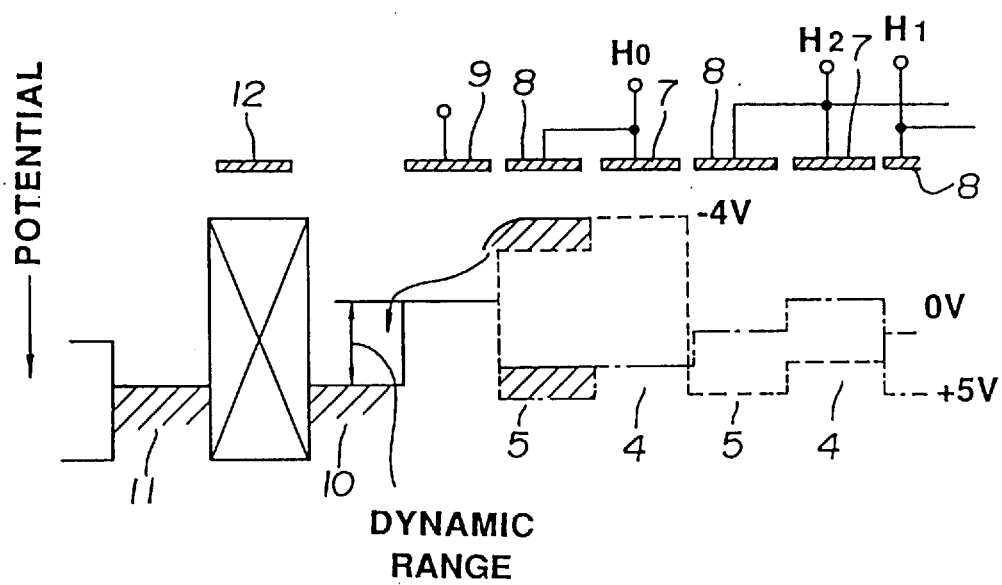
FIG. 2 is a model view of potential in the charge transferring apparatus shown in FIG. 1.

The potential applied to the output gate electrode 9 is not, e.g., +2 volts as in the previously proposed charge transferring apparatus but indicates a value in the vicinity of 0 volts, as is shown in FIG. 2, which is about 2 volts lower than that in the previously proposed charge transferring apparatus.

Hence, according to such a construction of a charge transferring apparatus, the potential well of the output gate is about 2 volts lower (shallower) than in the previously proposed charge transferring apparatus.

In addition, the potential well of the pair of the transfer electrodes 7, 8 located at the most downstream point of the transfer channel and adjacent to the charge detecting portion 10 when sweeping out the charge in the storage region 5 and transfer region 4 is also about 2 volts shallower than that in the previously proposed charge transferring apparatus. Hence, without increase in the power supply voltage, the output dynamic range can be widened.

Furthermore, if an impurity concentration in the transfer regions 4 and storage regions 5 is properly set, it is possible to widen the output dynamic range properly, deepening the whole potential well. This makes a transfer electric field stronger. Hence, the transferring efficiency can be enhanced, assuring the output dynamic range to some degree. A sharp and clear output waveform can, thus, be provided.

In the preferred embodiment described above, the present invention is applicable to bi-phase drive type floating diffusion amplification (FGA) charge transferring apparatus. However, the present invention can be applied to bi-phase or quadruple-phase type CCDs provided that they are buried type CCDs (BCCDs). In addition, the present invention can be applied to floating gate amplifying type charge transferring devices.

As described hereinabove, since the pair of transfer electrodes located adjacent to the charge detecting portion is driven by a drive pulse different from other pairs of transfer electrodes and the potential well of the last pair of the transfer electrodes, when the signal electric charge is transferred to the output gate portion at the last pair of the transfer electrodes, is made shallower than other pairs of transfer electrodes, the output dynamic range can be widened without increase in the power supply voltage, and the potential well in the transfer channel can wholly be deepened so that transfer efficiency can be improved.

It will fully be appreciated by those skilled in the art that the forgoing description has been made in terms of the preferred embodiments and various changes and modifications may be made without departing from the scope of the present invention which is to be defined by the appended claims.

What is claimed is:

1. A charge transfer apparatus comprising:

a) a plurality of electrodes aligned in a charge transfer direction including, a plurality of first electrodes, each of which is formed over a semiconductor charge storing region and a plurality of second electrodes, each of which is formed over a semiconductor charge transfer region for transferring charges in the charge transfer direction, each of said first electrodes being electrically interconnected to a corresponding second electrode to form a first electrode pair, and second and third electrode pairs, with the last electrode pair in the charge transfer direction being said first electrode pair and being electrically separated from the second and third electrode pairs;

b) a charge detecting portion adjacent to said first electrode pair;

c) an output gate electrode provided between said first electrode pair and said charge detecting portion; and d) a drive pulse generator for generating a first exclusive drive pulse for said first electrode pair and second and third drive pulses respectively for the second and third electrode pairs, said first drive pulse being synchronized with said second and third drive pulses and being in phase with the third drive pulse and having a phase opposite the second drive pulse, so that a potential well formed at the first electrode pair is shallower than a potential well of the third electrode pair;

wherein all the semiconductor transfer regions disposed under said second electrodes are doped with the same type and same concentration of doping.

2. A charge transfer apparatus as set forth in claim 1, wherein each of said semiconductor storage regions is an n type semiconductor region, and each of said semiconductor transfer regions is an n type semiconductor region located between storage regions.

3. A charge transfer apparatus as set forth in claim 2, wherein said transfer region and storage region are formed on a surface of a p type semiconductor region formed on an n type semiconductor substrate.

4. A charge transfer apparatus as set forth in claim 1, wherein the charge detecting portion comprises an $n^{++}$ type semiconductor region located at a location downstream in the charge transfer direction of and adjacent to the output gate electrode and an amplifier.

5. An apparatus as set forth in claim 4, wherein the apparatus comprises a multi-phase driven floating diffusion (FGA) charge transfer device.

6. An apparatus as set forth in claim 4, wherein the apparatus comprises a buried channel type CCD (BCCD).

7. An apparatus as set forth in claim 4, wherein the apparatus comprises a floating gate amplifying type charge transfer device.

8. A charge transfer apparatus as set forth in claim 1, wherein said second drive pulse and said third drive pulse have a swing range that extends from a first voltage up to a second voltage, said first drive pulse has a swing range that extends from a third voltage up to said second voltage, and said third voltage is less than said first voltage.

9. A charge transfer apparatus as set forth in claim 8, wherein said first voltage is zero volts, said second voltage is five volts, and said third voltage is −4 volts.

10. A charge transfer apparatus as set forth in claim 1, wherein said charge detecting portion comprises a floating diffusion region; said apparatus further comprising a precharge gate electrode adjacent said floating diffusion region.

11. A charge transfer apparatus as set forth in claim 10, further comprising precharge drain region adjacent said precharge gate electrode, said precharge drain region receiving a voltage potential of 12 volts or a multiple thereof.

12. A charge transfer apparatus as set forth in claim 10, wherein said precharge gate electrode receives a drive pulse which is synchronized with said first, second and third drive pulses.

* * * * *